(12) United States Patent
Bae et al.

(10) Patent No.: US 8,723,213 B2
(45) Date of Patent: May 13, 2014

(54) LIGHT EMITTING DEVICE AND LIGHT EMITTING DEVICE PACKAGE

(75) Inventors: Jung Hyeok Bae, Seoul (KR); Young Kyu Jeong, Seoul (KR); Kyung Wook Park, Seoul (KR); Duk Hyun Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 34 days.

(21) Appl. No.: 13/030,813

(22) Filed: Feb. 18, 2011

(65) Prior Publication Data

US 2011/0198660 A1 Aug. 18, 2011

(30) Foreign Application Priority Data

Feb. 18, 2010 (KR) .................. 10-2010-0014707

(51) Int. Cl.
*H01L 33/62* (2010.01)
*H01L 33/60* (2010.01)

(52) U.S. Cl.
USPC 257/99; 257/98; 257/E33.064; 257/E33.066; 257/E33.068

(58) Field of Classification Search
USPC .......................................................... 257/99
See application file for complete search history.

(56) References Cited

U.S. PATENT DOCUMENTS

| 6,744,071 | B2 | 6/2004 | Sano et al. | |
|---|---|---|---|---|
| 6,977,395 | B2 * | 12/2005 | Yamada et al. | 257/99 |
| 2007/0181895 | A1 | 8/2007 | Nagai | |
| 2008/0251808 | A1 * | 10/2008 | Kususe et al. | 257/98 |
| 2008/0265744 | A1 * | 10/2008 | Doi | 313/498 |
| 2009/0014748 | A1 * | 1/2009 | Hirao et al. | 257/99 |
| 2009/0267096 | A1 | 10/2009 | Kim | |
| 2011/0001161 | A1 | 1/2011 | Park et al. | |

FOREIGN PATENT DOCUMENTS

| DE | 102007043001 A1 | 3/2009 |
|---|---|---|
| JP | 2004-031945 A | 1/2004 |
| KR | 10-2003-0022940 A | 3/2003 |
| KR | 10-2004-0073434 | 8/2004 |
| KR | 10-2009-0113223 | 10/2009 |
| KR | 10-2009-0119259 | 11/2009 |
| WO | 2010/011074 A2 | 1/2010 |

\* cited by examiner

*Primary Examiner* — Johannes P Mondt
(74) *Attorney, Agent, or Firm* — McKenna, Long & Aldridge LLP

(57) ABSTRACT

Provided is a light emitting device. In one embodiment, a light emitting device including: a support member; a light emitting structure on the support member, the light emitting structure comprising a first conductive type semiconductor layer, a second conductive type semiconductor layer, and an active layer between the first conductive type semiconductor layer and the second conductive type semiconductor layer; a protective member at a peripheral region of an upper surface of the support member; an electrode including an upper portion being on the first conductive type semiconductor layer, a side portion extended from the upper portion and being on a side surface of the light emitting structure, and an extended portion extended from the side portion and being on the protective member; and an insulation layer between the side surface of the light emitting structure and the electrode.

20 Claims, 12 Drawing Sheets

LIGHT EMITTING DEVICE AND LIGHT EMITTING DEVICE PACKAGE

CROSS-REFERENCE TO RELATED APPLICATIONS

The present application claims priority under 35 U.S.C. §119(a) of Korean Patent Application No. 10-2010-0014707 filed on Feb. 18, 2010, which is hereby incorporated by reference in its entirety.

BACKGROUND

Embodiments relate to a light emitting device and a light emitting device package.

A light emitting diode (LED) is a semiconductor light emitting device converting current to light. In recent years, as the luminance of the LED increases gradually, the use of the LED as a light source for a display, a light source for a vehicle, and a light source for a lighting system is increasing. An LED emitting white light and having superior efficiency may be implemented by using a fluorescent material or combining individual LEDs that emit three primary colors.

The luminance of the LED depends on various conditions, such as the structure of an active layer, a light extracting structure capable of effectively extracting light to an outside, semiconductor material used in the LED, a chip size, and the type of a molding member enclosing the LED.

SUMMARY

Embodiments provide a light emitting device and a light emitting device package having a novel structure.

Embodiments also provide a light emitting device and a light emitting device package having an enhanced reliability.

Embodiments also provide a light emitting device and a light emitting device package being capable of reducing a light loss.

In one embodiment, a light emitting device including: a support member; a light emitting structure on the support member, the light emitting structure comprising a first conductive type semiconductor layer, a second conductive type semiconductor layer, and an active layer between the first conductive type semiconductor layer and the second conductive type semiconductor layer; a protective member at a peripheral region of an upper surface of the support member; an electrode including an upper portion being on the first conductive type semiconductor layer, a side portion extended from the upper portion and being on a side surface of the light emitting structure, and an extended portion extended from the side portion and being on the protective member; and an insulation layer between the side surface of the light emitting structure and the electrode.

In another embodiment, a light emitting device package includes a light emitting device, a package body, a lead electrode, and a socket. The light emitting device includes: a light emitting structure including a first conductive type semiconductor layer, a second conductive type semiconductor layer, and an active layer between the first conductive type semiconductor layer and the second conductive type semiconductor layer; a protective member at a peripheral region of an upper surface of the support member; an electrode including an upper portion being on the first conductive type semiconductor layer, a side portion extended from the upper portion and being on a side surface of the light emitting structure, and an extended portion extended from the side portion and being on the protective member; and an insulation layer between the side surface of the light emitting structure and the electrode. The package body where the light emitting device is disposed. The lead electrode on the package body, the lead electrode electrically connected to the light emitting device. The socket electrically connected to the electrode of the light emitting device and the lead electrode.

DETAILED DESCRIPTION OF THE EMBODIMENTS

In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, word "on," or "under," are will be described based on the accompanying drawings.

In the figures, the dimensions of layers and regions are exaggerated for clarity of illustration. In addition, the dimension of each part does not reflect an actual size.

Hereinafter, a light emitting device, a method for manufacturing the same, a light emitting device package, and a lighting system according to embodiments will be described with reference to the accompanying drawings.

EMBODIMENTS

Figure 1:
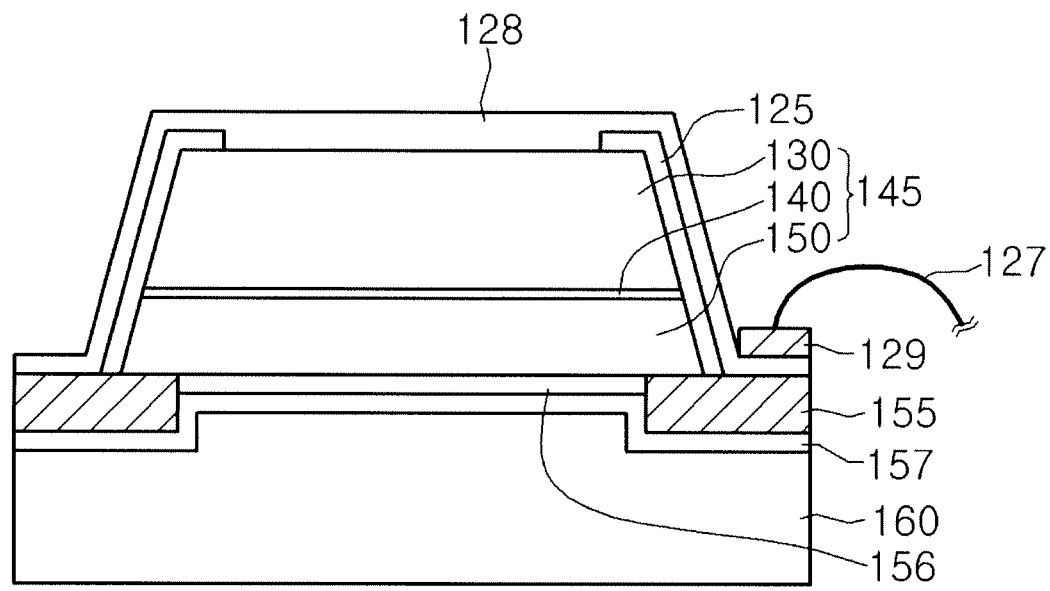
FIG. 1 is a cross-sectional view of a light emitting device according to an embodiment.
Figure 2:
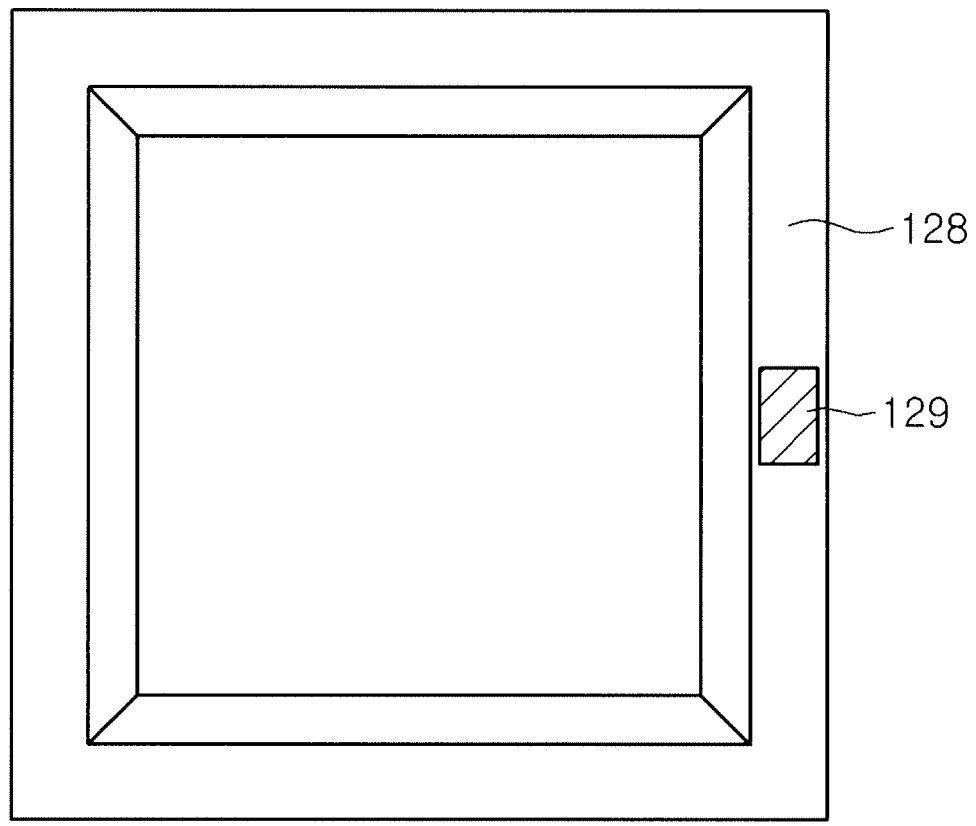
FIG. 2 is a plan view of the light emitting device of FIG. 1.

FIG. 1 is a cross-sectional view of a light emitting device 100 according to an embodiment, and FIG. 2 is a plan view of the light emitting device 100 of FIG. 1.

Referring to FIGS. 1 and 2, the light emitting device 100 according to the embodiment may include a conductive support member 160, a protective member 155 at a peripheral region of an upper surface of the support member 160, a light emitting structure 145 on the conductive support member 160 and the protective member 155, an electrode 128 on the first conductive type semiconductor layer, and an insulation layer 125 between the light emitting structure 145 and the electrode 128 for insulating them. The electrode 128 includes an upper portion electrically connected to an upper surface of the light emitting structure 145, a side portion extended from the upper portion and formed on a side surface of the first conductive type semiconductor layer, and an extended portion extended from the side portion and formed on the protective member 155.

The light emitting structure 145 is a structure generating a light, and includes at least a first conductive type semiconductor layer 130, an active layer 140 under the first conductive type semiconductor layer 130, and a second conductive type semiconductor layer 150 under the active layer 140.

The conductive support member 160 and the electrode 128 receive the power from the external power supply (not shown) and supply the power to the light emitting device 100.

Here, according to the embodiment, in order to connect the light emitting device 100 to the external power supply, a wire may be connected to the extended portion of the electrode 128. Thus, the amount that the light emitted from the light emitting structure 145 is lost by the wire can be minimized, and the damage of the light emitting structure 145 that may be generated when the wire is bonded can be prevented.

Hereinafter, elements of the light emitting device 100 will be described in detail.

The conductive support member 160 may include at least one selected from the group consisting of Ti, Cr, Ni, Al, Pt, Au, W, Cu, Mo and a semiconductor substrate doped with a dopant.

The reflective layer 157 may be formed on the conductive support member 160. The reflective layer 157 reflects light input from the light emitting structure 145, thereby making it possible to improve the light extracting efficiency of the light emitting device 100.

The reflective layer 157 may be made of metal having a high reflection efficiency. For example, the reflective layer 157 may include at least one of Ag, Al, Pt, Pd, Cu, or an alloy thereof.

An adhesion layer (not shown) may be formed between the reflective layer 157 and the conductive support member 160 so as to enhance an interfacial bonding force, but is not limited thereto.

The protective member 155 may be formed at the peripheral region of the upper surface of the reflective layer 157, with a first portion of the protective member 155 being located between the second conductive semiconductor layer 150 and the reflective layer 157 and contacted with the second conductive type semiconductor layer 150, and a second portion of the protective member 155 being contacted with the electrode 128, as illustrated in FIG. 1. The protective member 155 prevents the electrical short between the light emitting structure 145 and the conductive support member 160.

The protective member 155 may include insulative and transparent materials in order to minimize the light loss. For example, the protective member 155 may include at least one of $SiO_2$, $Si_xO_y$, $Si_3N_4$, $Si_xN_y$, $SiO_xN_y$, $Al_2O_3$, $TiO_2$, ITO, AZO (aluminum zinc oxide), and ZnO.

The ohmic contact layer 156 may be formed on the upper surface of the relective layer 157 and inside the protective member 155. The ohmic contact layer 156 may form an ohmic contact between the light emitting structure 145 and the reflective layer 157 or the conductive support member 160. For example, the ohmic contact layer 156 may include at least one of ITO (indium tin oxide), Ni, Pt, Ir, Rh, and Ag.

When the light emitting structure 145 is ohmic-contacted with the reflective layer 157 or the conductive support member 160, the ohmic contact layer 156 may be omitted.

The light emitting structure 145 may be formed on the ohmic contact layer 156. The light emitting structure 145 may include at least the first conductive type semiconductor layer 130, the active layer 140 under the first conductive type semiconductor layer 130, and the second conductive type semiconductor layer 150 under the active layer 140.

The first conductive type semiconductor layer 130 may include an n type semiconductor layer. The n type semiconductor layer may include semiconductor materials having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AkN, and InN. In addition, the n type semiconductor layer may be doped with n type dopant such as Si, Ge, and Sn.

The active layer 140 may include semiconductor materials having the compositional formula of $In_xAl_yGa_{1-x-y}N$ ($0 \leq x \leq 1$, $0 \leq y \leq 1$, $0 \leq x+y \leq 1$). The active layer 140 may have a quantum wire structure, a quantum dot structure, a single quantum well structure, or a multiple quantum well (MQW) structure, but the embodiment is not limited thereto. Electrons (or holes) injected through the first conductive type semiconductor layer 130 may be recombined with holes (or electrons) injected through the second conductive type semiconductor layer 150 at the active layer 140, so that the active layer 140 emits the light.

The second conductive type semiconductor layer 150 may includes a p type semiconductor layer. The p type semiconductor layer may include semiconductor materials having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AkN, and InN. In addition, the p type semiconductor layer may be doped with p type dopant such as Mg, Zn, Ca, Sr, or Ba.

Meanwhile, the first conductive type semiconductor layer 130 may include p type semiconductor layer, and the second conductive type semiconductor layer 150 may include n type semiconductor layer. Also, a third conductive type semiconductor layer (not shown) including n type or p type semiconductor layer may be on the second conductive type semiconductor layer 150. Accordingly, the light emitting device 100 may include at least one of an N-P junction structure, a P-N junction structure, an N-P-N junction structure, and a P-N-P junction structure. That is, the embodiment is not limited thereto.

A side surface of the light emitting structure 145 is subject to an isolation etching that separates the plurality of chips as a unit chip. The side surface of the light emitting structure 145 may be inclined by the isolation etching, and the protective member 155 may be exposed.

In the embodiment, a region on the protective member 155, where the electrode 128 is located, may be formed by the isolation etching.

The electrode 128 may be connected to the upper surface of the light emitting structure 145 (that is, the first conductive type semiconductor layer 130), and at least part of the electrode 128 may be formed on the protective member 155. That is, the electrode 128 may include an upper portion on the first conductive type semiconductor layer 130, the side portion extended form the upper portion and formed on a side surface of the first conductive type semiconductor layer 130, and the extended portion extended from the side portion and formed on the protective member 155.

The electrode 128 may include conductive material, and, more specifically, may include a metal or a conductive non-matal forming an ohmic contact with the first conductive type semiconductor layer 130. For example, the electrode 128 may include at least one selected from the group consisting of Cu, Ti, Zn, Au, Ni, Pt, Ir, Rh, Ag, ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, Ni/IrOx/Au/ITO, or ZnO. The bonding metal layer 129 electrically connected to the electrode 128 is connected to the external power supply by the wire. Thus, the bonding metal layer 129 may include metal, considering the connection with the external power supply and the current transfer characteristics. For example, the bonding metal layer 129 may include Ni, Cu, or alloy thereof.

Meanwhile, the electrode 128 may have different shapes depending on a transparency of the electrode 128.

As shown in FIGS. 1 and 2, when the electrode 128 includes a transparent material, the electrode 128 may be formed on an entire region of the light emitting structure 145 and the protective member 155. It is because the amount of light that is absorbed by the transparent electrode 128 among the light emitted from the light emitting structure 145 is small.

Also, the electrode 128 may have a predetermined pattern on the light emitting structure 145, but not limited thereto.

Figure 3:
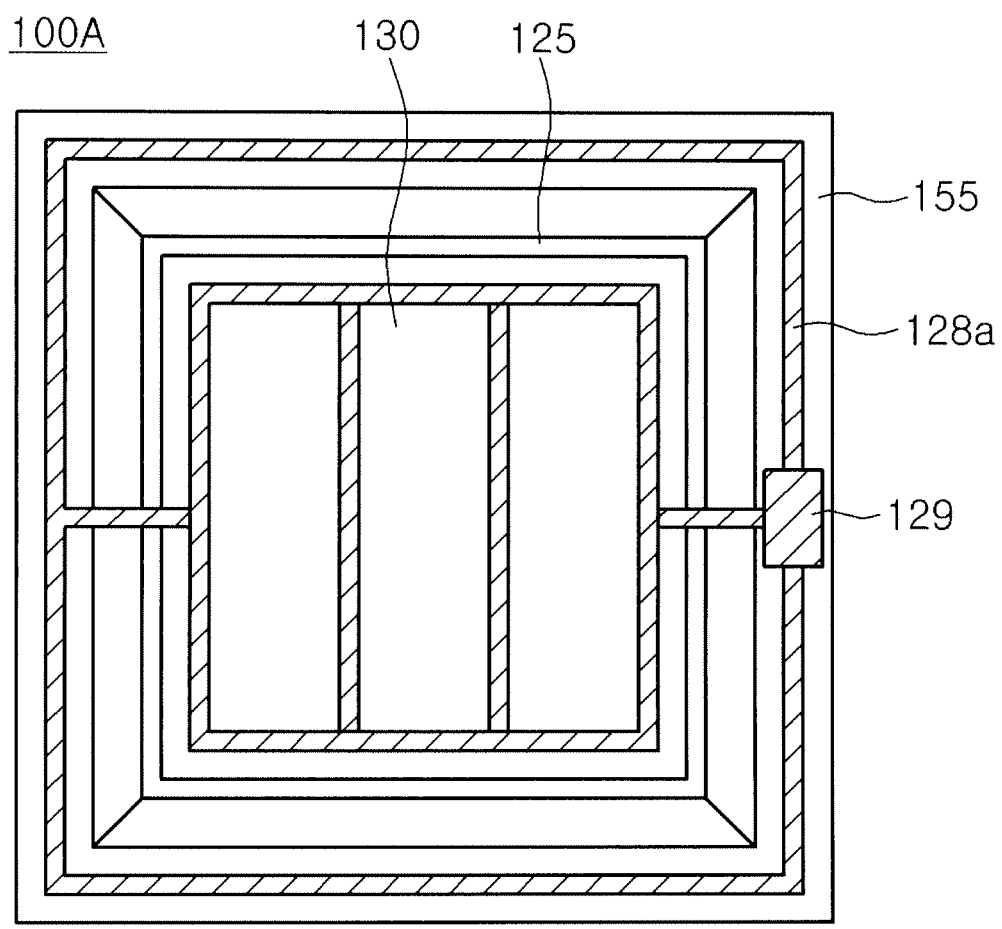
FIG. 3 is a plan view of a light emitting device according to another embodiment.

FIG. 3 is a plan view of a light emitting device 100A according to another embodiment.

When the electrode 128 includes opaque materials, for example, a metal having a high conductivity, the electrode 128 may have a predetermined pattern.

That is, in order to uniformly spread the power to the entire region of the upper surface of the first conductive type semiconductor layer 130 and to minimize the loss in the light emitted from the light emitting structure 145, the electrode 128a may have a predetermined pattern.

For example, as shown in FIG. 3, the electrode 128a on the first conductive type semiconductor layer 130 has a pattern with an opening, for example, a grid pattern, a spiral or helix pattern. Also, the pattern with the opening is connected to the extended portion on the protective member 155 along a line portion on the side surface of the light emitting structure 145. That ism the side portion of the electrode 128 has a line shape. The shape of the electrode 128a is not limited to thereto.

Meanwhile, the electrode 128a may have a plurality of layers. For example, the electrode 128a may include a first layer forming an ohmic contact with the first conductive type semiconductor layer 130, and a second layer on the first layer. The second layer may include a bonding metal that the wire can be easily bonded.

In addition, the bonding metal layer 129 may be formed on at least a part of the electrode 128a. The wire may be bonded on the bonding metal layer 129, thereby supplying the power to the light emitting device 100 from the external power supply. A plurality of the bonding metal layer 129 may be provided according to the desion of the light emitting device 100.

In FIG. 3, the line portion of the electrode 128a and the bonding metal layer 129 are separately formed, and are electrically connected from each other. Accordingly, the electrode 128a and the bonding metal layer 129 may have different materials. Thus, the electrode 128a may include a material having a superior ohmic contact property, and the bonding metal layer 129 may include a material considering the connection with the external power supply and the current transfer characteristics. However, the embodiment is not limited thereto.

Figure 4:
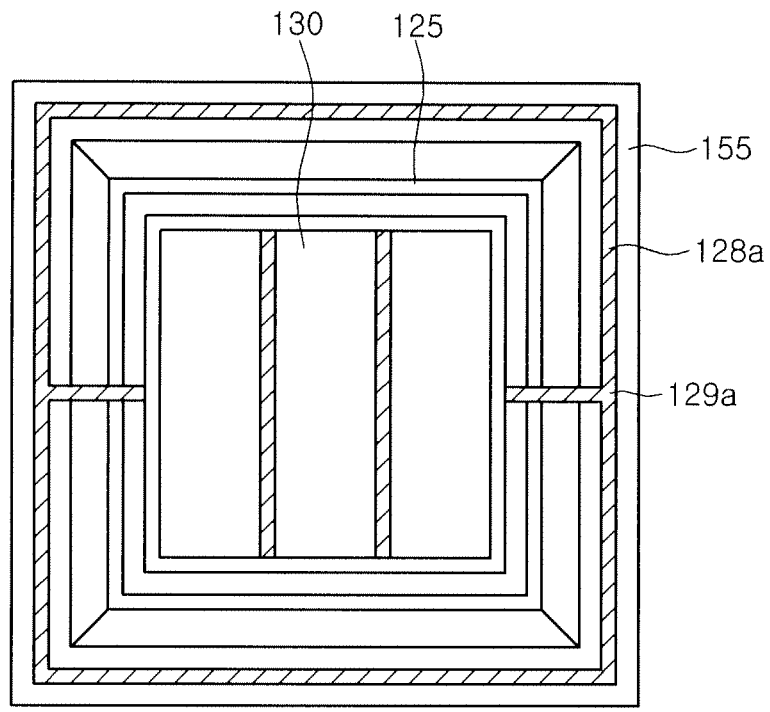
FIG. 4 is a plan view of a light emitting device according to a modified example.
Figure 5:
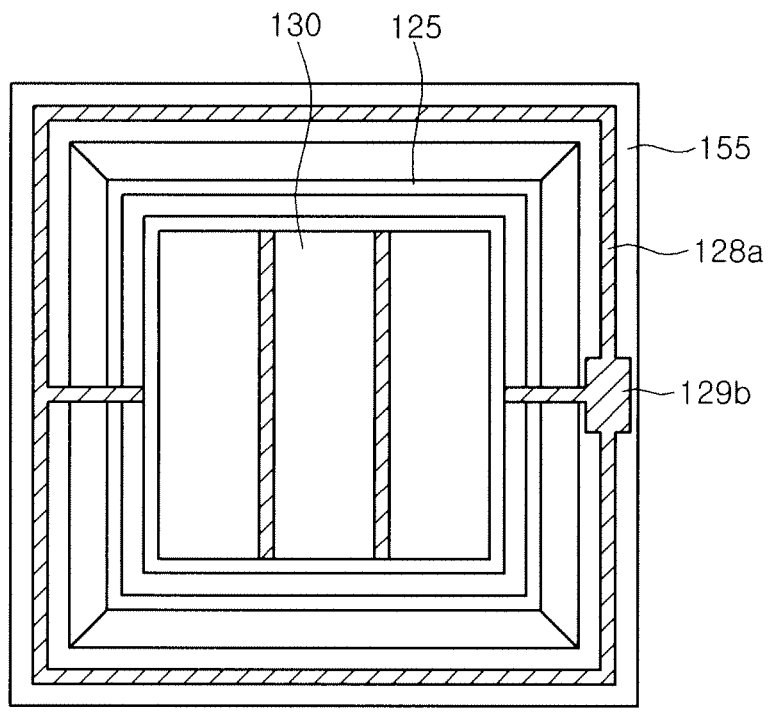
FIG. 5 is a plan view of a light emitting device according to another modified example.

Thus, as shown in FIGS. 4 and 5, the line portion of the electrode 128a and the bonding metal layer 129a and 129b may include the same material and be integrally formed. According to this, the electrode 128a and the bonding metal layer 129a and 129b can be formed at the same process, and thus the process can be simplified. Here, as shown in FIG. 4, the bonding metal layer 129a may have a width the same as that of the line portion of the electrode 128a. Selectively, as shown in FIG. 5, the bonding metal layer 129b may have a width larger than that of the line portion of the electrode 128a, and thus the connection between the bonding metal layer 129b and the external power supply can be easily performed.

According to the embodiment, the wire is bonded to the electrode 128 or 128a, or the bonding metal layer 129, 129a, or 129b on the protective member 155, not to the light emitting structure 145. Thus, the light loss by the wire can be minimized, and the damage of the light emitting structure 145 that may be generated when the wire is bonded can be prevented.

The insulation layer 125 is formed between the electrode 128 or 128a and the light emitting structure 145 for isolating them from each other. Thus, the insulation layer 125 is formed on the side surface of the light emitting structure 145, thereby preventing the electrical short between the light emitting structure 145 and the electrode 128 or 128a.

Also, the insulation layer 125 may be further formed between the protective member 155 and the electrode 128, but is not limited thereto.

The insulation layer 125 may include insulative and transparent materials in order to minimize the light loss. For example, the insulation layer 125 may include at least one selected from the group consisting of $SiO_2$, $Si_xO_y$, $Si_3N_4$, $Si_xN_y$, $SiO_xN_y$, $Al_2O_3$, and $TiO_2$.

As another embodiment, in the case that the electrode 128a has the predetermined pattern as in FIG. 3, the insulation layer 125 may have a shape corresponding to the pattern of the first electrode 128a.

Hereinafter, a method for manufacturing the light emitting device 100 according to an embodiment.

FIGS. 6 to 11 are cross-sectional views illustrating a method for manufacturing a light emitting device according to an embodiment.

Figure 6:
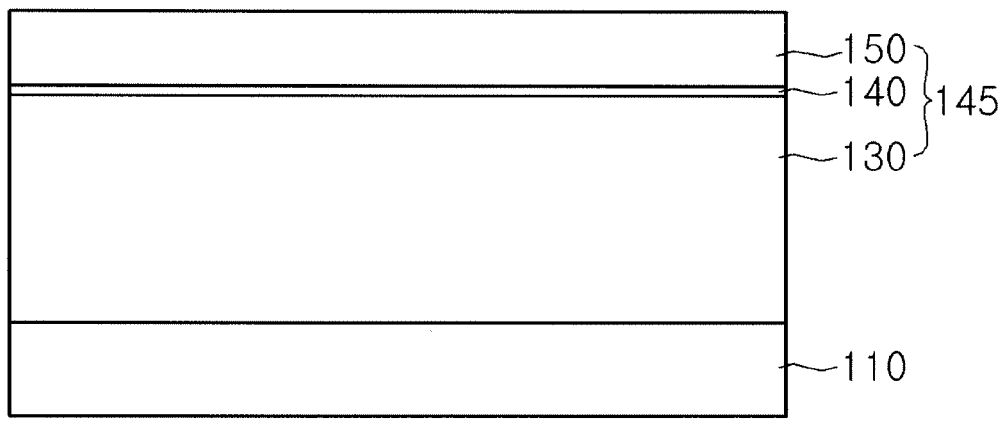
FIGS. 6 to 11 are cross-sectional views illustrating a method for manufacturing a light emitting device according to an embodiment.

Referring to FIG. 6, the light emitting structure 145 may be formed on a substrate 110.

The substrate 110 may be made of at least one of, for example, sapphire ($Al_2O_3$), SiC, Si, GaAs, GaN, ZnO, GaP, InP, and Ge, but is not limited thereto.

The light emitting structure 145 may be formed on a substrate 110. The light emitting structure 145 may include a plurality of semiconductor layers, and include at least the first conductive type semiconductor layer 130, the active layer 140 under the first conductive type semiconductor layer 130, and the second conductive type semiconductor layer 150 under the active layer 140.

The light emitting structure 145 may be formed, for example, using a MOCVD (Metal Organic Chemical Vapor Deposition) method, a CVD (Chemical Vapor Deposition) method, a PECVD (Plasma-Enhanced Chemical Vapor Deposition) method, an MBE (Molecular Beam Epitaxy) method, an HVPE (Hydride Vapor Phase Epitaxy) method, etc., but is not limited thereto.

Figure 7:
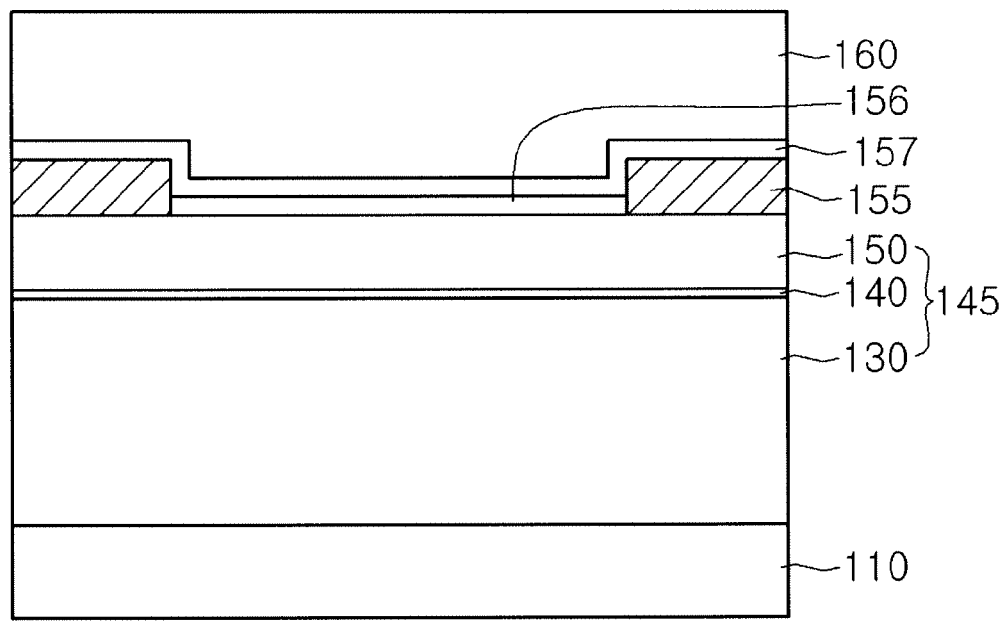

Referring to FIG. 7, the protective member 155 may be formed on the peripheral region of the upper surface of the light emitting structure 145, and the conductive support member 160 may be fomed on the light emitting structure 145 and the protective member 155.

The protective member 155 may be formed by the deposition process or the photolithography process, but is not limited thereto.

The conductive support member 160 may be formed by the deposition process or the plating process. Alternatively, the conductive support member 160 may have a sheet shape, and may be attached. The embodiment is not limited thereto.

Also, the reflective layer 157 may be formed under the conductive support member 160 in order to enhance the light extraction efficiency. Further, the ohmic contact layer 156 may be formed between the second conductive type semiconductor layer 50.

Figure 8:
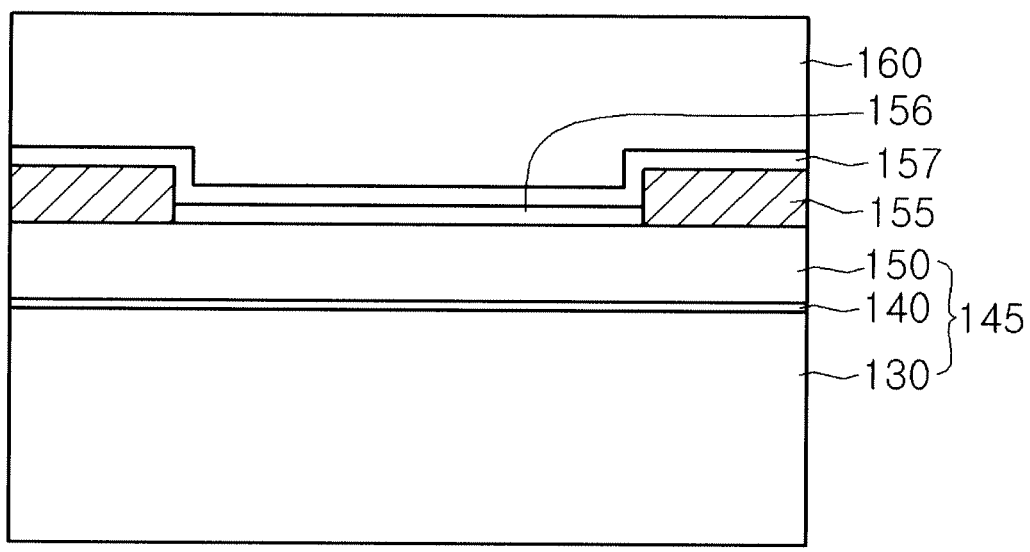

Referring to FIGS. 7 and 8, the substrate 110 may be removed. The substrate 110 may be removed by a laser lift off (LLO) method or an etching method, but is not limited thereto.

Meanwhile, another etching process such as ICP/RIE (Inductively Coupled Plasma/Reactive Ion Etch) may be performed in order to polish the surface of the first conductive type semiconductor layer 130 exposed after removing the substrate 110.

Figure 9:
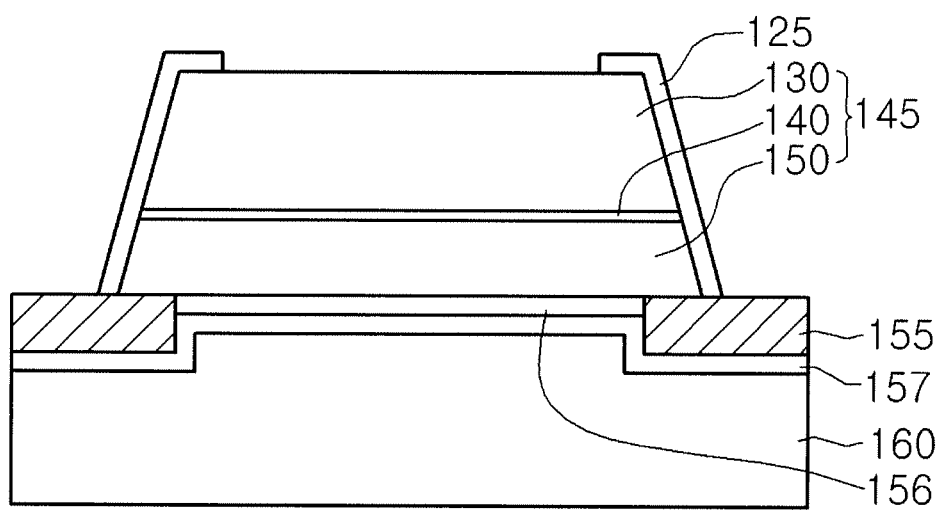

Referring to FIG. 9, the light emitting structure 145 is subject to the isolation etching, such that the light emitting structure 145 is separated to a unit chip, and the insulation layer 125 is formed.

The upper surface of the protective member 155 may be exposed by the isolation etching.

The insulation layer 125 may be formed, for example, using a PECVD (Plasma-Enhanced Chemical Vapor Deposition) method, an E-beam deposition method, etc.

The insulation layer 125 may include insulative and transparent materials in order to minimize the light loss. For example, the insulation layer 125 may include at least one selected from the group consisting of $SiO_2$, $Si_xO_y$, $Si_3N_4$, $Si_xN_y$, $SiO_xN_y$, $Al_2O_3$, and $TiO_2$.

The embodiment is not limited to the case that the insulation layer 125 is formed on the side surface of the light emitting structure 145. Thus, the insulation layer 125 may be formed on a part of the upper surface of the light emitting structure 145.

Figure 10:
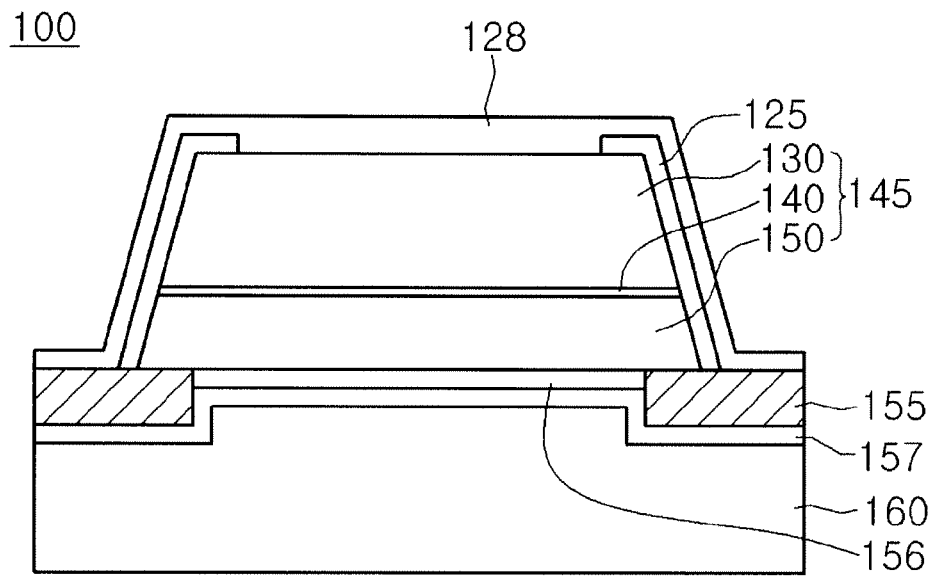

Referring to FIG. 10, the electrode 128 may be formed to be in contact with the light emitting structure 145. At least a part of the electrode 128 may be formed on the protective member 155. That is, the electrode 128 may include the upper portion, the side portion, and the extended portion. The upper portion is formed on the upper surface of the first conductive type semiconductor layer 130. The side portion is extended from the upper portion and is formed on a side surface of the light emitting structure 145. The extended portion is extended from the side portion and is formed on the protective member 155.

The electrode 128 may include conductive material, and, more specifically, may include a metal or a conductive nonmetal forming an ohmic contact with the first conductive type semiconductor layer 130. For example, the electrode 128 may include at least one selected from the group consisting of Cu, Ti, Zn, Au, Ni, Pt, Ir, Rh, Ag, ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, Ni/IrOx/Au/ITO, or ZnO.

The electrode 128 may be formed on the entire regin of the light emitting structure 145, or may be have the predetermined pattern. The shaped of the electrode 128 may be determined according to the desion of the light emitting device 100 and/or the material of the electrode 128.

Figure 11:
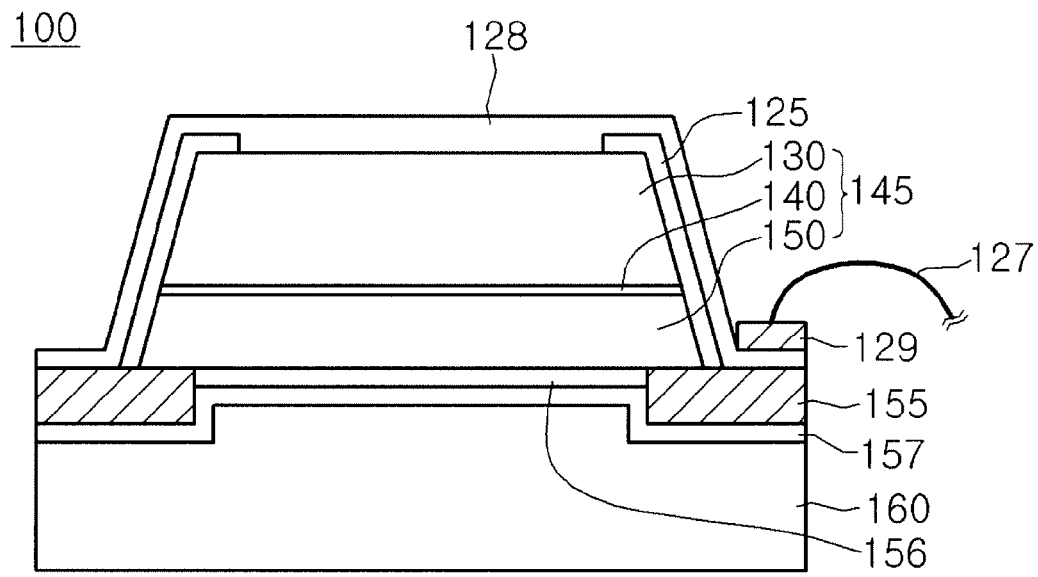

Referring to FIG. 11, the bonding metal layer 129 is formed on at least on the upper portion of the electrode 128 formed on the protective member 155, and the wire 127 is bonded to the bonding metal layer to be connected to the external power supply. Accordingly, the light emitting device 100 according to the embodiment is provided.

In the above embodiment, the light emitting device having vertical topology, but is not limited thereto. Thus, it may be applied to the light emitting device having lateral topology.

<First Light Emitting Device Package>

Figure 12:
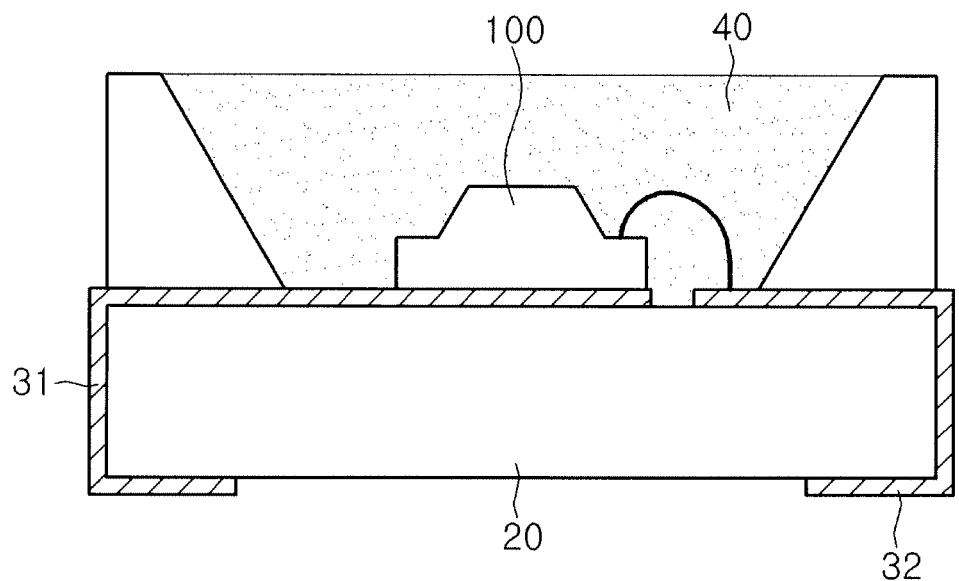
FIG. 12 is a cross-sectional view of a first light emitting device package including a light emitting device according to an embodiment.

FIG. 12 is a cross-sectional view of a light emitting device package including the light emitting device 100 according to the embodiment.

Referring to FIG. 12, the light emitting device package according to the embodiment includes a package body 20, first and second lead electrodes 31 and 32 mounted on the package body 20, a light emitting device 100 according to the embodiments, which is mounted on the package body 20 and electrically connected to the first and second lead electrodes 31 and 32, and a molding member 40 enclosing the light emitting device 100.

The package body 20 may be formed including a silicon material, a synthetic resin material, or a metallic material, and may have an inclination surface around the light emitting device 100.

The first lead electrode 31 and the second lead electrode 32 are electrically separated, and supply an electric power to the light emitting device 100. Also, the first and second lead electrodes 31 and 32 may reflect light generated from the light emitting device 100 to thus increase light efficiency, and may emit heat generated from the light emitting device 100 to an outside.

The light emitting device 100 may be mounted on the package body 20 or on the first lead electrode 31 or the second lead electrode 32.

For example, the light emitting device 100 may be electrically connected to the first lead electrode 31 and the second lead electrode 32 by using the wire.

According to the embodiment, the wire is bonded to the electrode 128 or 128a, or the bonding metal layer 129, 129a, or 129b on the protective member 155. Thus, the light loss by the wire can be minimized, and the damage of the light emitting structure 145 that may be generated when the wire is bonded can be prevented The molding member 40 may enclose and protect the light emitting device 100. Also, a fluorescent material may be included in the molding member 40 to change the wavelength of light emitted from the light emitting device 100.

<Second Light Emitting Device Package>

Hereinafter, the second light emitting device package will be described. However, the contents the same as or similar to the first light emitting device package will be simply described or be omitted.

Figure 13:
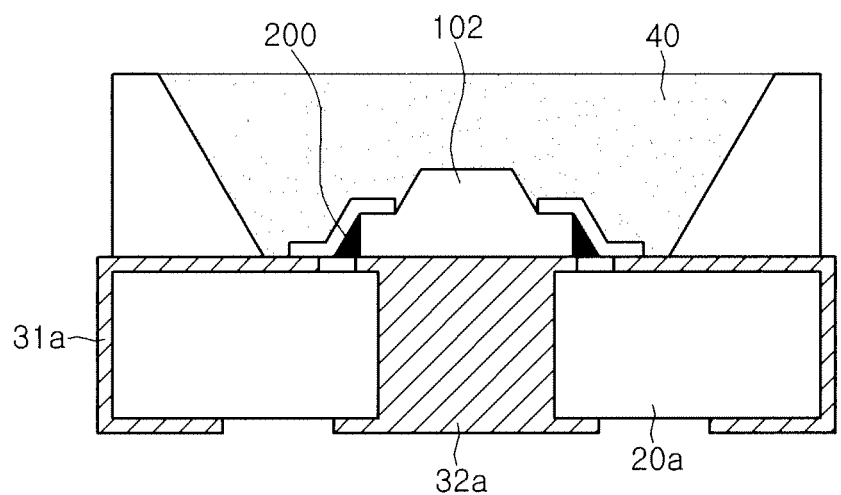
FIG. 13 is a cross-sectional view of a second light emitting device package including a light emitting device according to an embodiment.
Figure 14:
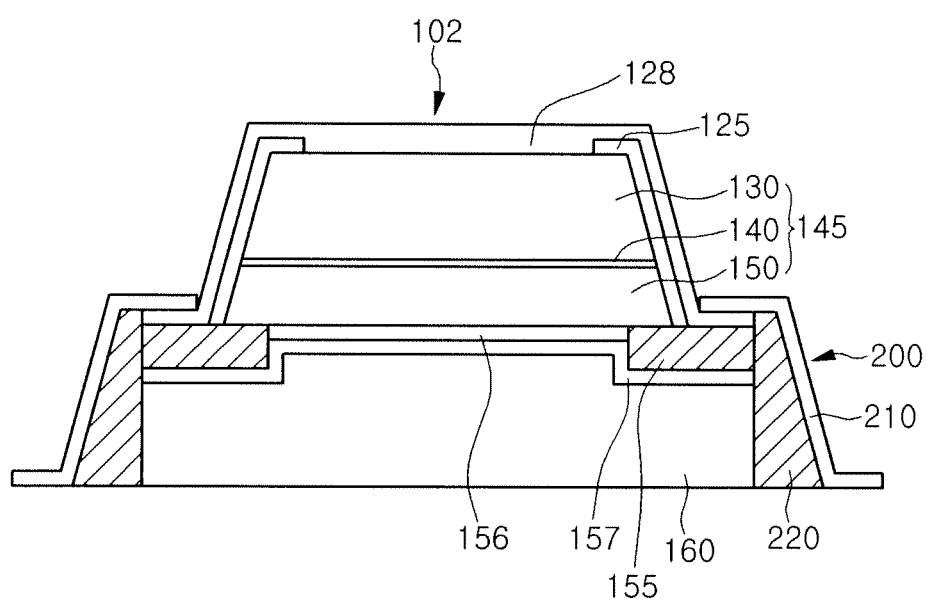
FIG. 14 is an extended cross-sectional view of a light emitting device and a socket in the second light emitting device package of FIG. 13.
Figure 15:
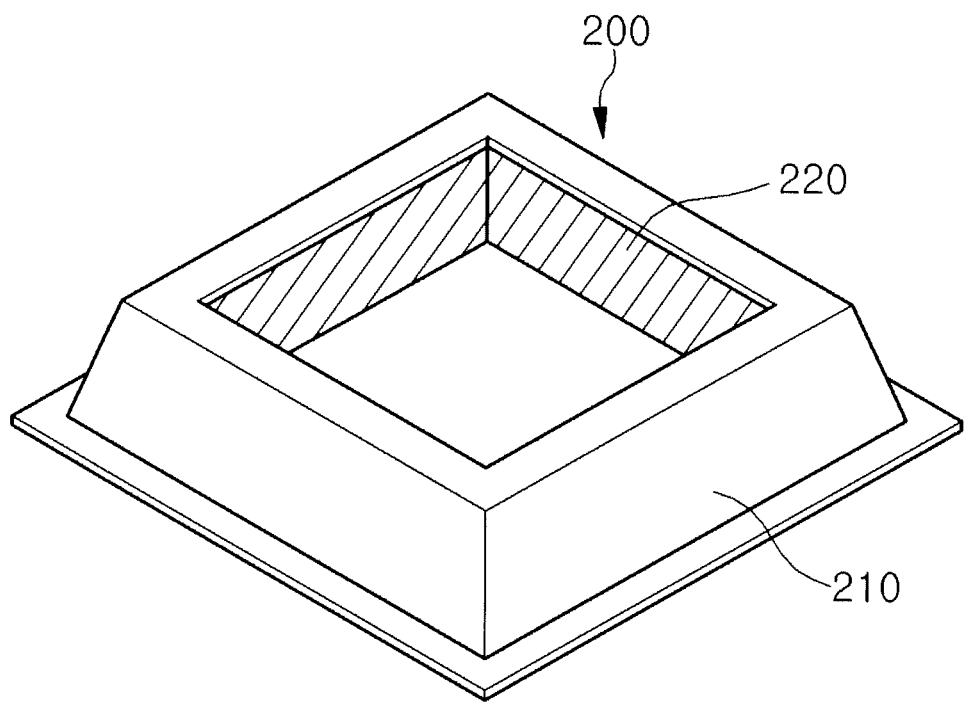
FIG. 15 is a disassembled perspective view of the light emitting device and the socket in the second light emitting device package of FIG. 13.
Figure 15:
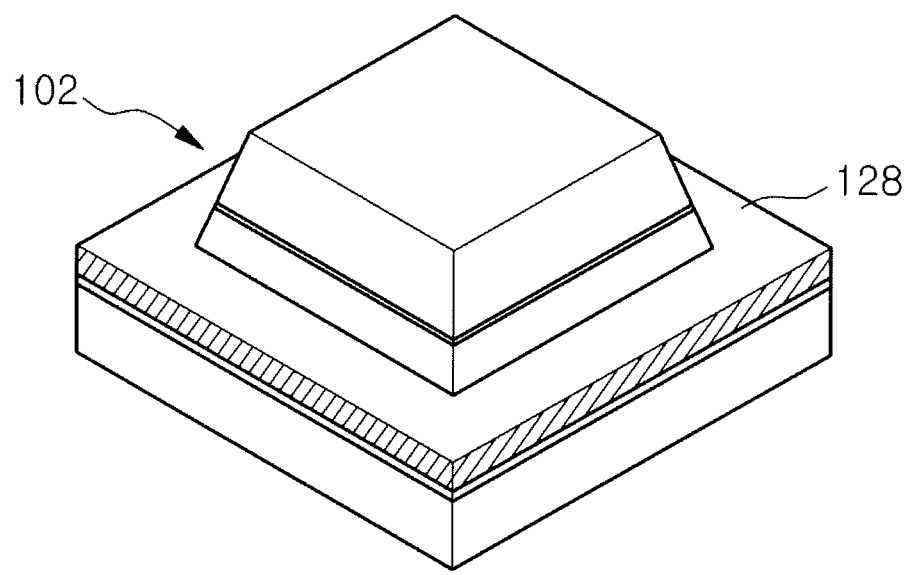

FIG. 13 is a cross-sectional view of the second light emitting device package including the light emitting device 102 according to the embodiment. FIG. 14 is an extended cross-sectional view of a light emitting device 102 and a socket 200 in the second light emitting device package of 13. FIG. 15 is a disassembled perspective view of the light emitting device 102 and the socket 200 in the second light emitting device package of FIG. 13.

Referring to FIGS. 13 to 15, the second light emitting device package may include a package body 20a, a lead electrode 31a on the package body 20a, a through electrode 32a penetrating from the upper surface of the package body 20a to the bottom surface thereof, a light emitting device 102 electrically connected to the through electrode 32a, and a socket 200 electrically connecting the light emitting device 102 and the lead electrode 31a, and a molding member 40 enclosing the light emitting device 100.

In the second light emitting device package, the light emitting device 102 is electrically connected to the lead electrode by the socket 200, instead of the wire.

Specifically, the socket 200 includes an opening for inserting the light emitting structure 145, a socket electrode 210 electrically connected to the electrode 128 of the light emitting device 102, and an insulating body 220 insulating the socket electrode 210 and the conductive support member 160 of the light emitting device 102.

When the light emitting structure 145 is inserted to the opening, the electrode 128 and the socket electrode 210 are electrically connected. That is, a part of the socket electrode 210 may protrude toward the inside of the insulation body 220 so that the socket electrode 210 can be in contact with the electrode 128. In order to the easy contact between the electrode 128 and the socket electrode 210, the thickness of the insulation body 220 may be substantially the same as that of the conductive support member 160.

As shown in FIGS. 13 to 15, the socket electrode 210 is formed on the outside of the insulation body 220, and one end of the socket electrode 210 is in contact with the electrode 128 and the other end of the socket electrode 210 is in contact with the lead electrode 31a. However, the embodiment is not limited thereto. Thus, the socket 200 may have various shapes.

Figure 16:
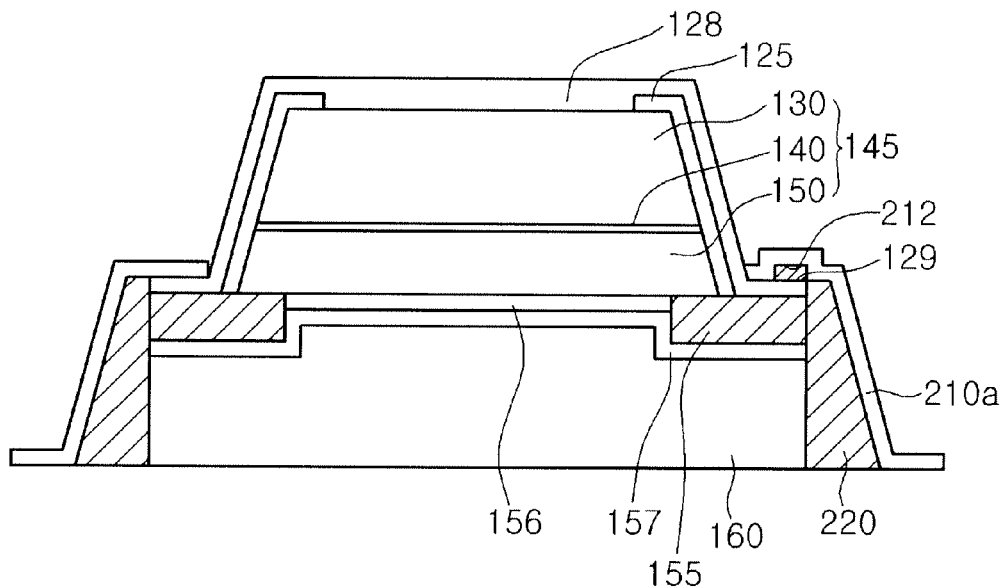
FIG. 16 is a cross-sectional view of a first modified example of the second light emitting device package.

Meanwhile, as shown FIG. 16, when the socket electrode 210a is in contact with the bonding metal layer 129 formed on the electrode 128, the socket electrode 210a may include a concave portion 212 having a shape corresponding to the bonding metal layer 129. However, the embodiment is not limited thereto.

Figure 17:
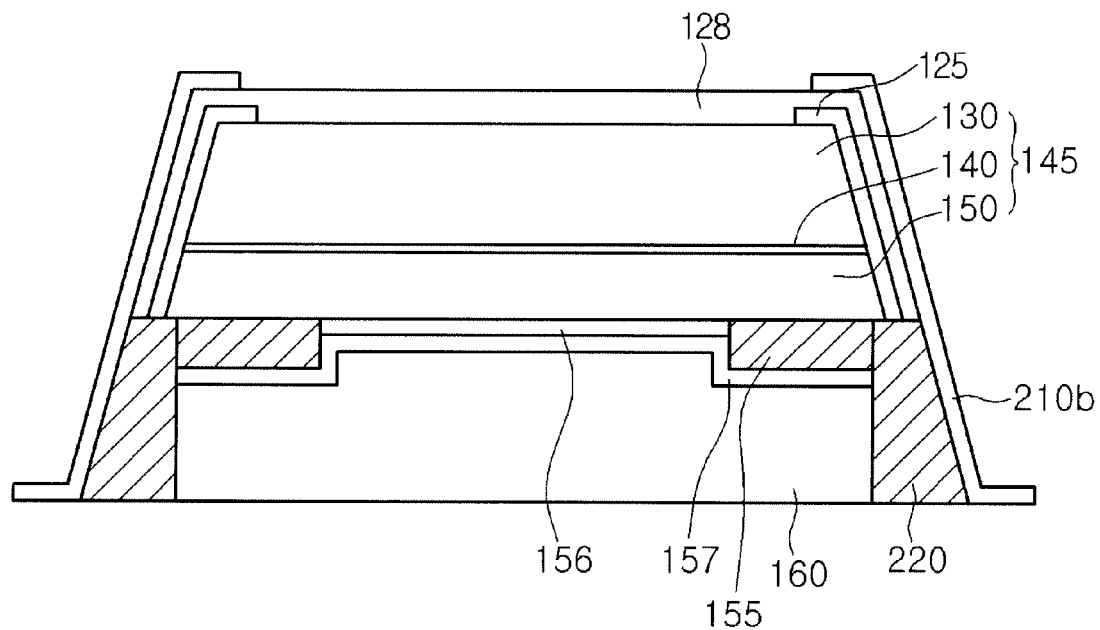
FIG. 17 is a cross-sectional view of a second modified example of the second light emitting device package.

In FIG. 15, the socket electrode 210 is the upper portion of the electrode 128 formed on the protective member 155 (that is, the extended portion). However, the embodiment is not limited thereto. As an modified example, as shown in FIG. 17, the socket electrode 210b may surround the side portion of the electrode 128 formed on the side surface of the light emitting structure 145, and may extend to a part of the upper surface of the first conductive type semiconductor layer 130.

According to the embodiment, since the power is provided by using the socket 200 instead of the wire, the light emitting device 102 can be easily electrically connected to the lead electrode 31a and the through electrode 32a, compared with the wire bonding process. Also, the light emitting device 102 can be strongly fixed and coupled to the package body 20a.

The above electrical connection structure is an example. Thus, the embodiment is not limited to the structure including the lead electrode 31a and the through electrode 32a.

The light emitting device package according to the current embodiment may mount at least one of the light emitting devices according to the foregoing embodiments, but the present invention is not limited thereto. The light emitting device package may include a plurality of light emitting device packages which are arrayed on a substrate. A plurality of optical members, such as a light guide panel, a prism sheet, a diffusion sheet, a fluorescent sheet, and the like may be arranged on a path of light emitted from the light emitting device package. The light emitting device package, substrate and optical members may function as a backlight unit or lighting unit, and a lighting system may include, for example, a backlight unit, a lighting unit, an indicator unit, a lamp, a streetlamp, etc.

Figure 18:
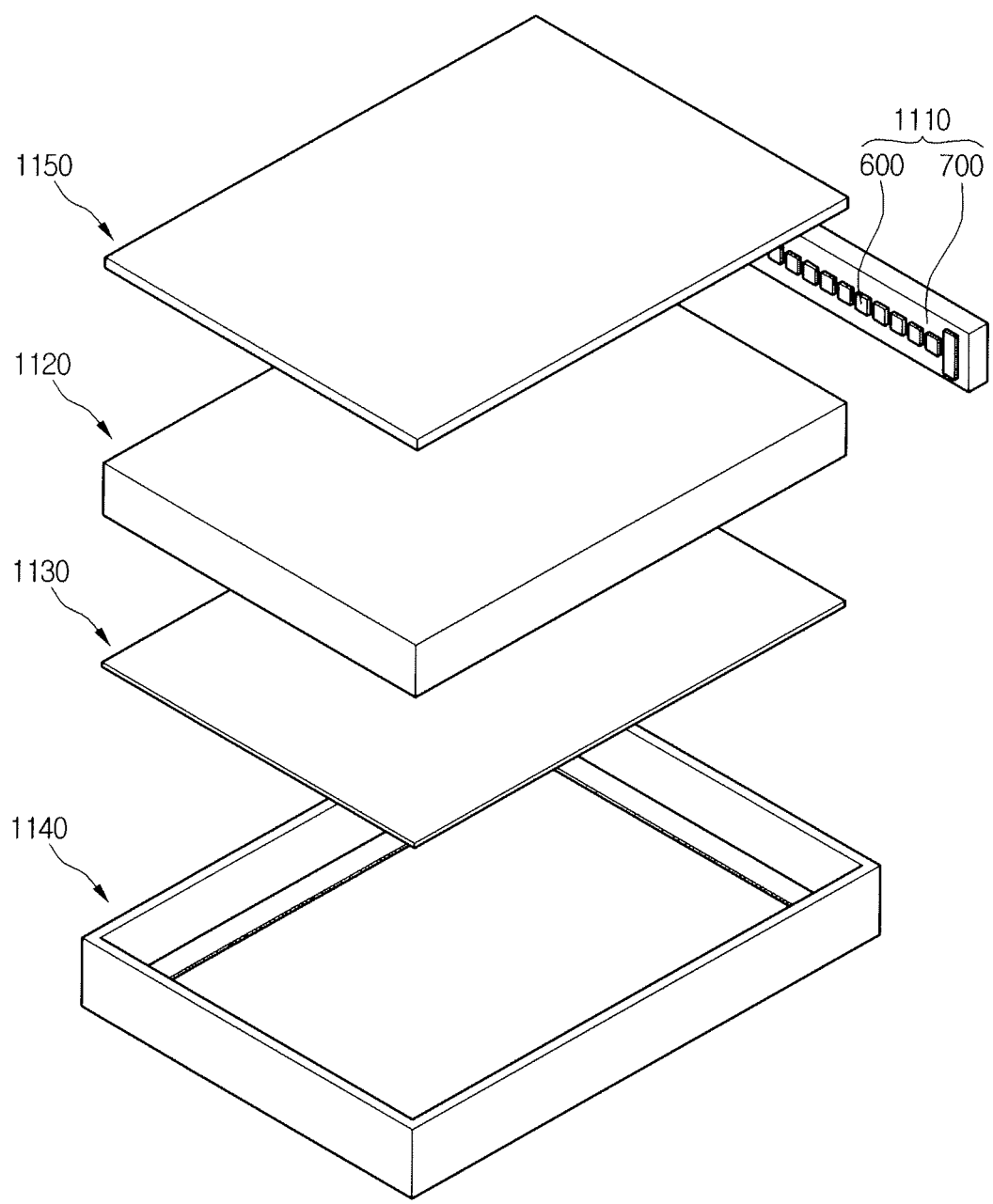
FIG. 18 is a disassembled perspective view of a backlight unit including a light emitting device or a light emitting device package according to an embodiment.

FIG. 18 is a disassembled perspective view of a backlight unit including a light emitting device or a light emitting device package according to an embodiment. The backlight unit 1100 of FIG. 18 is one example of lighting systems, and the present invention is not limited thereto.

Referring to FIG. 18, the backlight unit 1100 may include a bottom cover 1140, a light guide member 1120 disposed in the bottom cover 1140, and a light emitting module 1110 disposed on at least one side surface of the light guide member 1120 or under the light guide member 1120. Also, a reflective sheet 1130 may be disposed under the light guide member 1120.

The bottom cover 1140 may be formed in a box shape a top surface of which is opened such that the light guide member 1120, the light emitting module 1110 and the reflective sheet 1130 can be received. The bottom cover 1140 may be formed of a metal or resin material, but the invention is not limited thereto.

The light emitting module 1110 may include a substrate 700 and a plurality of light emitting device packages 600 mounted on the substrate 700. The plurality of light emitting device packages 600 may provide light to the light guide member 1120. In the light emitting module 1110 according to the current embodiment, it is exemplarily shown that the light emitting device packages 600 are mounted on the substrate 700, but the light emitting devices according to the embodiments may be mounted directly on the substrate 700.

As shown in FIG. 18, the light emitting module 1110 may be disposed on at least one of inner side surfaces of the bottom cover 1140, and thus may provide light to at least one of the side surfaces of the light guide member 1120.

It is also to be understood that the light emitting module 1110 may be disposed under the light guide member 1120 inside the bottom cover 1140 to provide light toward a bottom surface of the light guide member 1120. However, since such a constitution may be modified according to the design of the backlight unit 1100, the invention is not limited thereto.

The light guide member 1120 may be disposed inside the bottom cover 1140. The light guide member 1120 may convert the light provided from the light emitting module to a planar light source and guide the converted plane light source to a display panel (not shown).

The light guide member 1120 may be, for example, a light guide panel (LGP). The LGP may be formed of, for example, one of acryl-series resin such as polymethyl metaacrylate (PMMA), polyethylene terephthlate (PET), poly carbonate (PC), COC, and polyethylene naphthalate resin.

An optical sheet 1150 may be disposed on the light guide member 1120.

The optical sheet 1150 may include, for example, at least one of a diffusion sheet, a light-condensing sheet, a brightness enhancement sheet and a fluorescent sheet. For example, the optical sheet 1150 may be configured by the diffusion sheet, the light-condensing sheet, the brightness enhancement sheet and the fluorescent sheet stacked. In this case, the diffusion sheet 1150 diffuses the light emitted from the light emitting module 1110 uniformly, and the diffused light may be condensed on the display panel (not shown) by the light-condensing sheet. At this time, the light emitted from the light-condensing sheet is a randomly polarized light, and the brightness enhancement sheet may increase the polarization of the light emitted from the light-condensing sheet. The light-condensing sheet may be, for example, a horizontal and/or vertical prism sheet. Also, the brightness enhancement sheet may be, for example, a dual brightness enhancement film. Also, the fluorescent sheet may be a transparent plate or film including a fluorescent material.

The reflective sheet 1130 may be disposed under the light guide member 1120. The reflective sheet 1130 may reflect light emitted from the bottom surface of the light guide member 1120 toward a light emitting surface of the light guide member 1120.

The reflective sheet 1130 may be formed of resin material having good reflectivity, for example, PET, PC, PVC resins, or the like, but the invention is not limited thereto.

Figure 19:
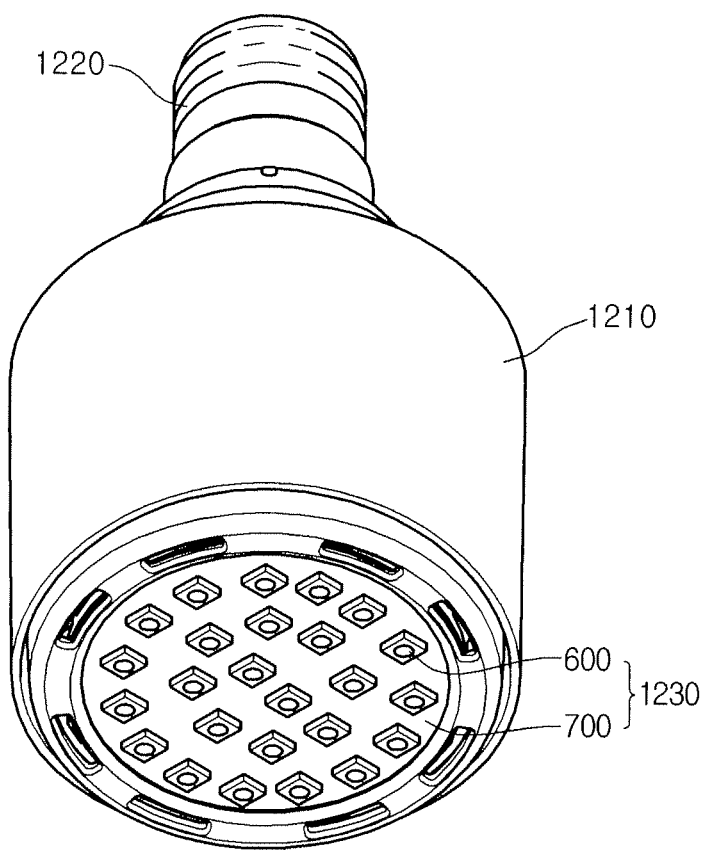
FIG. 19 is a perspective view of a lighting unit including a light emitting device or a light emitting device package according to an embodiment.

FIG. 19 is a perspective view of a lighting unit including a light emitting device or a light emitting device package according to an embodiment. The lighting unit 1200 of FIG. 19 is an example of lighting systems and the invention is not limited thereto.

Referring to FIG. 19, the lighting unit 1200 may include a case body 1210, a light emitting module 1230 installed in the case body 1210, and a connection terminal installed in the case body 1210 to be supplied with an electric power from an external power source.

The case body 1210 may be preferably formed of a material having good heat shielding characteristic, for example, a metal material or a resin material.

The light emitting module 1230 may include a substrate 700, and a light emitting device package 600 mounted on the substrate 700. In the light emitting module 1230 according to the current embodiment, it is exemplarily shown that the light emitting device packages 600 are mounted on the substrate 700, but the light emitting devices according to the embodiments may be mounted directly on the substrate 700.

The substrate 700 may be an insulator substrate on which a circuit pattern is printed, and may include, for example, a general printed circuit board (PCB), a metal core PCB, a flexible PCB, a ceramic PCB, etc.

Also, the substrate 700 may be formed of a material to efficiently reflect light, and a surface thereof may be formed in a color capable of efficiently reflecting light, for example, white color, silver color, or the like.

At least one light emitting device package 600 may be mounted on the substrate 700. Each of the light emitting device packages 600 may include at least one light emitting diode (LED). The light emitting diode may include a color LED emitting red, green, blue or white light, and a UV LED emitting ultraviolet (UV).

The light emitting module 1230 may have a combination of several LEDs so as to obtain desired color and luminance. For example, the light emitting module 1230 may have a combination of a white LED, a red LED, and a green LED so as to obtain a high color rendering index (CRI). A fluorescent sheet may be further disposed on a path of light emitted from the light emitting module 1230. The fluorescent sheet converts the wavelength of the light emitted from the light emitting module. For example, when the light emitted from the light emitting module 1230 has a blue wavelength band, the fluorescent sheet may include a yellow fluorescent material, so that the light, which is emitted from the light emitting module 1230 and passes through the fluorescent sheet, finally appears as white light.

The connection terminal 1220 may be electrically connected to the light emitting module 1230 to supply an electric power to the light emitting module 1230. As shown in FIG. 19, the connection terminal 1220 may be screwed and coupled to an external power, but the invention is not limited thereto. For example, the connection terminal 1220 may be made in a pin type and inserted into an external power, or may be connected to the external power through a power line.

As described above, the lighting system may include at least one of a light guide member, a diffusion sheet, a light-condensing sheet, a brightness enhancement sheet and a fluorescent sheet on a traveling path of light to obtain a desired optical effect.

As described above, since the lighting system according to this embodiment includes the light emitting device or light emitting device package having the enhanced reliability and reducing the light loss, the lighting system can show superior characteristics.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a conductive support member;
   a light emitting structure on the conductive support member, the light emitting structure comprising a first conductive type semiconductor layer, a second conductive type semiconductor layer, and an active layer between the first conductive type semiconductor layer and the second conductive type semiconductor layer;
   a protective member at a peripheral region of an upper surface of the conductive support member;
   an electrode comprising an upper portion being on the first conductive type semiconductor layer, a side portion extended from the upper portion and being on a side surface of the light emitting structure, and an extended portion extended from the side portion and being on the protective member;
   a reflective layer between the second conductive type semiconductor layer and the conductive support member; and
   an insulation layer between the side surface of the light emitting structure and the electrode,
   wherein a first portion of the protective member is contacted with the second conductive type semiconductor layer of the light emitting structure and a second portion of the protective member is contacted with the electrode, and
   wherein the first portion of the protective member is formed between the second conductive type semiconductor layer and the reflective layer.

2. The light emitting device of claim 1, further comprising a bonding metal layer on at least a part of the extended portion.

3. The light emitting device of claim 1, wherein the side surface of the light emitting structure is inclined.

4. The light emitting device of claim 1, wherein the insulation layer comprises at least one selected from the group consisting of $SiO_2$, $Si_xO_y$, and $SiO_xN_y$.

5. The light emitting device of claim 1, wherein the electrode comprises a metal having an electrical conductivity and forming an ohmic contact with the first conductive type semiconductor layer.

6. The light emitting device of claim 1, wherein the electrode is formed on an entire region of the light emitting structure and the second portion of the protective member.

7. The light emitting device of claim 6, wherein the electrode is formed of a transparent conductive material.

8. The light emitting device of claim 7, wherein the transparent conductive material comprises at least one selected from the group consisting of ITO, IZO(In—ZnO), GZO (Ga—ZnO), AZO(Al—ZnO), AGZO(Al—Ga ZnO), IGZO (In—Ga ZnO), IrOx, RuOx, RuOx/ITO, or ZnO.

9. The light emitting device of claim 1, further comprising an ohmic contact layer between the second conductive type semiconductor layer and the reflective layer.

10. The light emitting device of claim 2, wherein the bonding metal layer is overlapped with the second portion of the protective member.

11. The light emitting device of claim 1, wherein the second portion of the protective member is disposed between the electrode and the reflective layer.

12. The light emitting device of claim 1, wherein a portion of the insulating layer is disposed on a part of an upper surface of the light emitting structure.

13. The light emitting device of claim 1, wherein the insulating layer is disposed between the protective member and the electrode.

14. A light emitting device comprising:
a conductive support member;
a light emitting structure on the conductive support member, the light emitting structure comprising a first conductive type semiconductor layer, a second conductive type semiconductor layer, and an active layer between the first conductive type semiconductor layer and the second conductive type semiconductor layer;
a protective member at a peripheral region of an upper surface of the conductive support member;
an electrode comprising an upper portion being on the first conductive type semiconductor layer, a side portion extended from the upper portion and being on a side surface of the light emitting structure, and an extended portion extended from the side portion and being on the protective member;
a reflective layer between the second conductive type semiconductor layer and the conductive support member; and
an insulation layer between the side surface of the light emitting structure and the electrode,
wherein a first portion of the protective member is contacted with the second conductive type semiconductor layer of the light emitting structure and a second portion of the protective member is contacted with the electrode, and
wherein the second portion of the protective member is disposed between the electrode and the reflective layer.

15. The light emitting device of claim 14, further comprising a bonding metal layer on at least a part of the extended portion.

16. The light emitting device of claim 15, wherein the electrode is formed on an entire region of the light emitting structure and the second portion of the protective member.

17. The light emitting device of claim 16, wherein the electrode is formed of a transparent conductive material.

18. The light emitting device of claim 15, further comprising an ohmic contact layer between the second conductive type semiconductor layer and the reflective layer.

19. The light emitting device of claim 15, wherein the electrode comprises a metal having an electrical conductivity and forming an ohmic contact with the first conductive type semiconductor layer.

20. The light emitting device of claim 15, wherein the bonding metal layer is overlapped with the second portion of the protective member.

* * * * *